United States Patent [19]

Millard et al.

[11] 4,109,183

[45] Aug. 22, 1978

[54] THIRD CHANNEL OSCILLOSCOPE DISPLAY FOR TRIGGER SIGNAL

[75] Inventors: Joe K. Millard; Eldon C. Cornish, both of Colorado Springs, Colo.

[73] Assignee: Hewlett-Packard Company, Palo Alto, Calif.

[21] Appl. No.: 675,667

[22] Filed: Apr. 12, 1976

[51] Int. Cl.² ............................................. G01R 13/28
[52] U.S. Cl. .................................................. 315/392
[58] Field of Search ........................ 315/391, 392, 409

[56] References Cited

U.S. PATENT DOCUMENTS

| | | | |
|---|---|---|---|
| 3,124,884 | 3/1964 | Capecelatro et al. | 315/392 |
| 3,795,834 | 3/1974 | Andrews et al. | 315/392 |

Primary Examiner—Maynard R. Wilbur
Assistant Examiner—T. M. Blum
Attorney, Agent, or Firm—Michael L. Sherrard

[57] ABSTRACT

An oscilloscope has an additional vertical display mode to enable the display of the trigger signal, activating the sweep generating circuit, simultaneously with the display of the normal vertical channels. The triggering source, level, slope and subtle time relationships can be verified and examined continuously and concurrently with the measurements upon the normal vertical channels. The displayed trigger signal is in correct time relationship with the normal vertical channels and the trigger level threshold is identified.

1 Claim, 3 Drawing Figures

| SIGNAL | STATE | | | |
|---|---|---|---|---|
| Q(U2A) | 1 | 0↑ | 1↑ | 0 |
| Q̄(U2A) | 0 | 1 | 0 | 1 |
| I AND Q̄ (U3A) | 1 | 0B* | 1 | 1 |
| Q(U4A) | 1 | 1 | 0 | 1 |
| Q̄(U4A) | 0 | 0 | 1 | 0 |
| Q(U2A) AND Q(U4A) (U3C) | 0A*↑ | 1↑ | ITV* | 0A*↑ |

↑ FEEDBACK TO FLIP OR FLOP A FLIPFLOP

* ENABLED

FIG 3

THIRD CHANNEL OSCILLOSCOPE DISPLAY FOR TRIGGER SIGNAL

BACKGROUND OF THE INVENTION

This invention relates generally to multiple trace triggerable oscilloscopes and more particularly to a circuit for simultaneously displaying the trigger signal and two input signals.

Conventional triggerable oscilloscopes generally can be selectively triggered from either an external trigger input (external), the power line input (line) or one of the normal input signals (internal). The selected trigger signal initiates a horizontal sweep when its amplitude passes through a pre-selected trigger level threshold. Since the sweep generator has an inherent time delay from the time a trigger is produced until the display actually starts on the cathode-ray tube screen, the display signal is deliberately delayed to allow the leading-edge portion of a rapidly changing waveform to be displayed.

In addition, conventional triggerable oscilloscopes contain binary electronic switching logic which allows two normal input signals to be simultaneously displayed in a chop or alternate mode. The chop mode is normally clocked by a chop oscillator and the alternate mode by the detection of the end of the horizontal sweep. Rapid switching between the two signals results in a simultaneous display due to the 'memory' of the phosphors in a conventional cathode-ray tube.

Certain known circuits also allow the user to replace the normal input channel display with a display of the trigger signal alone. Such a circuit is described in U.S. Pat. No. 3,795,834 entitled, OSCILLOSCOPE HAVING EXTERNAL TRIGGER DISPLAY MODE issued on Mar. 5, 1974 to Roland Eugene Andrews et al. These circuits result in the undesired loss of the input display when the trigger signal display is selected. This is particularly disadvantageous to a user when it is desired to make subtle timing measurements between the trigger signal and the signals input to channels A and B. These critical timing measurements require the simultaneous display of both the trigger signal and the two input signals. An example would be the determination of the small time changes resulting from an adjustment of the trigger level threshold. These circuits are also incapable of continuously monitoring the trigger signal while concurrently displaying input signals. A user would also desire to view the trigger signal exactly as applied to the trigger recognition circuit so that he can choose a trigger level threshold that avoids the likelihood of triggering on noise or other waveform anomalies. In addition, it is desirable to be able to identify the precise point on the trigger signal that initiates the sweep.

Accordingly, the principal objects of this invention are to provide a display mode for simultaneously displaying the trigger signal and the input signals, in correct time relationship, for displaying the trigger signal exactly as applied to the trigger recognition circuit, and for identifying the point on the trigger signal that initiates the sweep. Other and incidental objects of the present invention will become apparent from a study of the following detailed description.

These objects are accomplished in accordance with the preferred embodiment of the invention by electronically multiplexing the trigger signal and the input signals on channels A and B when either the alternate or chopped display is selected and the sweep trigger signal display logic is activated, to produce a three channel display. In either chopped or alternate display mode the electronic switching logic is transformed from a binary counter to a ternary counter upon activation of the trigger signal display, which allows the multiplexing of the three signals resulting in a simultaneous three channel display.

BRIEF DESCRIPTION OF THE DRAWINGS

FIG. 3 is a table of the sequential logic states of the electronic switching logic of FIGS. 1 and 2 when it is active as a ternary counter.

DETAILED DESCRIPTION OF THE PREFERRED EMBODIMENT

The operation of the present invention in its preferred embodiment will be described, followed by a detailed discussion of the implementing electronics.

Figure 1:
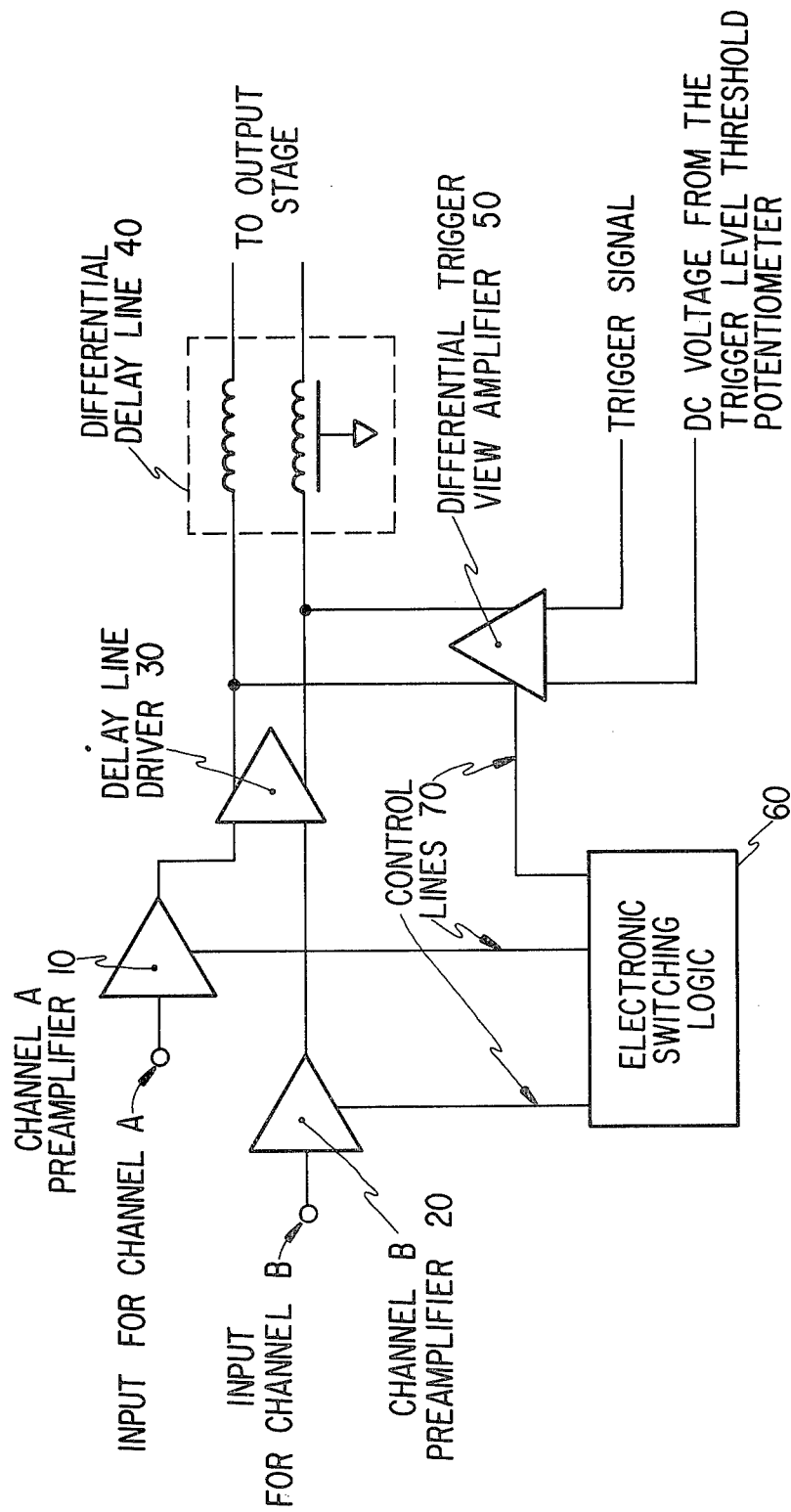
FIG. 1 is a block diagram of the preferred embodiment of the present invention.

Referring to FIG. 1, an input for channel A is applied to a channel A preamplifier 10 and an input for channel B is applied to a channel B preamplifier 20. The outputs from the preamplifiers 10 and 20 are applied to a delay line driver 30 which drives a differential delay line 40. The trigger signal and a DC voltage from the trigger level threshold potentiometer corresponding to a selected trigger level are applied to a differential trigger view amplifier 50. The output of the differential trigger view amplifier 50 is applied directly to the differential delay line 40. Electronic switching logic 60 selectively disables or enables preamplifiers 10 and 20 and differential trigger view amplifier 50 by means of control lines 70.

The electronic switching logic 60 is characterized by the following operation. Activating the trigger view mode, when channels A and B are being viewed in either the alternate or chopped mode, transforms the electronic switching logic from a binary multiplexer into a ternary multiplexer. This sequentially enables the preamplifiers 10 and 20 and the differential trigger view amplifier 50 to provide a three channel multiplexed signal on delay line 40 and a resultant three channel display on the cathode-ray tube. The resultant three channel display includes displays of channels A and B and the trigger signal. The trigger signal input to the differential trigger view amplifier 50 may be selected from an external trigger input, a power line input, or from channel A or B. The differential output from differential trigger view amplifier 50 is vertically biased in response to a DC voltage from a trigger level threshold potentiometer, located elsewhere in the oscilloscope, such that the selected trigger level threshold always corresponds to the center horizontal graticule on the display. Changing the trigger level threshold displaces the displayed trigger signal vertically; thus, the portion of the waveform initiating the sweep can be readily observed.

Figure 2:
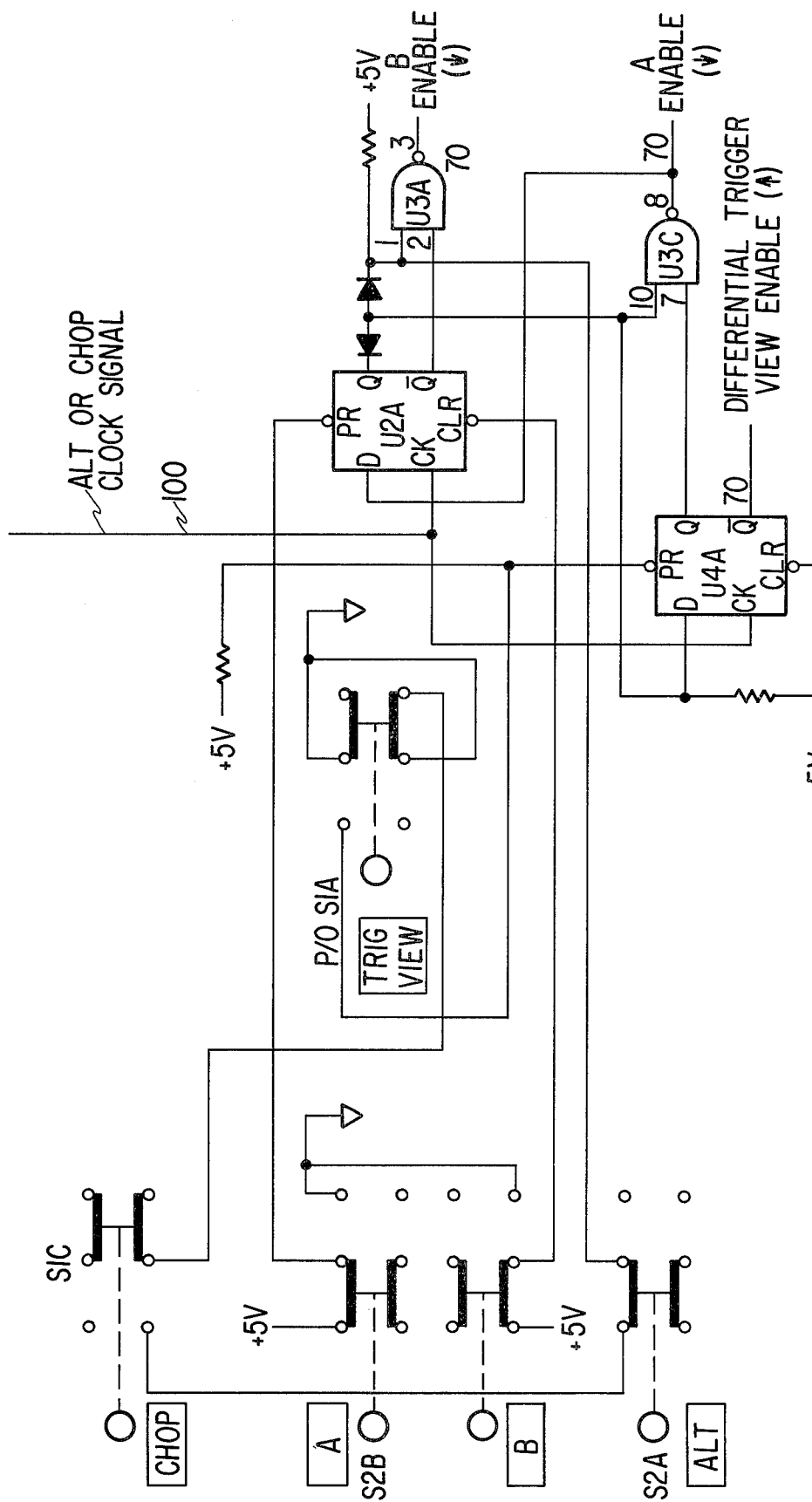
FIG. 2 is a detailed schematic diagram of the electronic switching logic of FIG. 1.

A detailed schematic diagram of the electronic switching logic 60 is provided in FIG. 2. The circuit is illustrated with the CHOP switch S1C and the TRIG VIEW switch P/OS1A both in their activated position. A clock signal is applied to line 100 from a chop oscillator, located elsewhere in the oscilloscope, which provides a clock reference for flipflops U2A and U4A. The voltages applied to the negative true preset and clear inputs of flipflops U2A and U4A are held high, thereby enabling those flipflops. The voltage applied to pin 1 of NAND gate U3A is also held high. The above-described configuration of electronic switching logic 60 constitutes a ternary counter. Assuming an initial condition with the Q output voltages of flipflops U2A and U4A high, the output at pin 8 of NAND gate U3C is low, thus enabling the channel A preamplifier 10 of FIG. 1. On the sequent clock pulse on line 100, the low output at pin 8 of NAND gate U3C is transferred to the Q output of flipflop U2A, flopping the $\overline{Q}$ output of flipflop U2A high. The output at pin 3 of NAND gate U3A goes low, which enables channel B preamplifier 20 of FIG. 1. Channel A preamplifier 10 is disabled by the high output at pin 8 of NAND gate U3C. On the sequent clock pulse on line 100, the low Q output of flipflop U2A is transferred to the Q output of flipflop U4A, flopping the $\overline{Q}$ output of flipflop U4A high and thereby enabling the differential trigger view amplifier 50. The high output at pin 8 of NAND gate U3C is simultaneously transferred to the Q output of flipflop U2A, flipping the $\overline{Q}$ output of flip-flop U2A low and disabling the channel B preamplifier 20 by setting the output pin 3 of NAND gate U3A high. On the sequent clock pulse on line 100 the high Q output of flipflop U2A is transferred to the Q output of flipflop Q4A, flipping the $\overline{Q}$ output of flipflop U4A low and thereby disabling the differential trigger view amplifier 50. The low output at pin 8 of NAND gate U3C enables the Channel A preamplifier 10 and returns the electronic switching logic 60 to the initial condition chosen above. The sequential logic states of the electronic switching logic 60, when configured as the ternary counter described above, are shown in FIG. 3.

When the TRIG VIEW switch P/OS1A is returned to its inactive position, the preset input of flipflop U4A is forced low, thus disabling flipflop U4A, setting the Q output of flipflop U4A high and disabling the differential trigger view amplifier 50 by providing a low signal at the $\overline{Q}$ output of flipflop U4A. The electronic switching logic 60 is now configured as a conventional binary multiplexer consisting of flipflop U2A and NAND gates U3A and U3C.

Thus, the present invention allows an additional display mode for triggerable oscilloscopes which results in the simultaneous display of the trigger signal as well as the input channels. It will now be appreciated that the aforementioned and other desirable objects have been achieved; however, it should be noted that the particular embodiment of the invention, which is shown and described herein, is intended as merely illustrative and not as restrictive of the invention.

We claim:

1. In a triggerable oscillographic instrument for providing a display of input electrical signals, the instrument comprising means for generating first and second deflection signals responsive to first and second input electrical signals, horizontal sweep means responsive to an output of a trigger threshold detector which compares a trigger signal to a selectable trigger level threshold, and means for generating a third vertical deflection signal in response to said trigger signal, the improvement comprising:
   means for generating a clock signal;
   first and second flip-flops, each having a clock input coupled to receive the clock signal, each having complementary first and second outputs, each having a data input, the data input of said second flip-flop coupled to the first output of said first flip-flop;
   a first NAND gate responsive to the first outputs of said first and second flip-flops and with the output thereof coupled to the data input of said first flip-flop;
   means for selectively disabling the second flip-flop and presetting the first output therefrom to a predetermined voltage; and
   means for enabling and disabling said means for generating first, second and third deflection signals in response to the output of said first NAND gate, the second output of said first flip-flop, and the second output of said second flip-flop respectively.

* * * * *